US006518590B1

(12) United States Patent
Hinton et al.

(10) Patent No.: US 6,518,590 B1

(45) Date of Patent: Feb. 11, 2003

(54) FIELD EMISSION TRANSISTOR

(75) Inventors: Gaylen R. Hinton, Idaho Falls, ID (US); David Summers, Salt Lake City, UT (US)

(73) Assignee: H & K Labs, Provo, UT (US)

( * ) Notice: Subject to any disclaimer, the term of this patent is extended or adjusted under 35 U.S.C. 154(b) by 33 days.

(21) Appl. No.: 09/649,316

(22) Filed: Aug. 28, 2000

(51) Int. Cl.[7] .............................. H01L 29/06; H01J 1/46

(52) U.S. Cl. ............................ 257/10; 257/11; 313/308; 313/309; 313/310; 438/20

(58) Field of Search ...................... 257/10, 11; 313/308, 313/309, 310, 336, 351; 438/20

(56) References Cited

U.S. PATENT DOCUMENTS

| | | | | | |
|---|---|---|---|---|---|
| 5,300,853 | A | * | 4/1994 | Watanabe et al. ........... | 313/309 |
| 5,461,280 | A | * | 10/1995 | Kane .......................... | 313/531 |
| 5,859,493 | A | * | 1/1999 | Kim ........................... | 313/309 |

* cited by examiner

*Primary Examiner*—Steven Loke
*Assistant Examiner*—Donghee Kang

(57) ABSTRACT

Field emission transistors where either N type or P type devices are made with an insulated gate isolated from both the emitter and the collector. Such devices have input voltage levels that match the output levels, and as such are fully cascadable and integrable. Emitter and collector functions are combined in combinations to make complimentary pairs, NAND gates and NOR gates.

9 Claims, 8 Drawing Sheets

FIELD EMISSION TRANSISTOR

FIELD OF THE INVENTION

This invention relates to field emission transistors.

BACKGROUND OF THE INVENTION

Numerous field emission devices have been known in the art. Examples of such prior art include U.S. Pat. Nos. 4,578,614; 5,469,015; 5,739,628; and 5,955,833. Such devices are generally made with semiconductor micro-fabrication techniques, and include an emitter with a sharp point or edge to concentrate the applied electric fields to greater than $10^9$ volts/meter in order to stimulate field emission of electrons. Also included in such devices is a gate or grid spaced between the emitter and a collector. Such gates either restrict or enhance the electric field at the tip of the emitter in order to diminish or augment electron emission from said emitter toward said collector.

Field emission devices are capable of extremely fast switching speeds, small sizes, and high operating temperatures, however prior art devices have been unable to come to significant commercial success due to a number of problems.

Such prior art devices are created with difficult fabrication techniques, and experience a variety of functional weaknesses. Such functional weaknesses include high operational voltages, poor switching characteristics, and the inability of such devices to be easily integrated together into usable circuits.

The above mentioned prior art necessarily has high operational voltage requirements because of the need to have the gate positioned between the emitter and the collector, and the fact that they cannot be made in complimentary pairs to enhance the field of each device. As the electric field density is proportional to distance, the greater distance between the emitter and the collector necessitates a higher applied voltage to get the required $10^9$ volts/meter at the emitter tip.

U.S. Pat. No. 5,461,280 teaches that a photon source impinging upon the emitter can lower the required applied voltage, but said patent teachings still have the inherent problem of the gate positioned between the emitter and the collector, which keeps the operational voltage high.

Said gate positioning also creates a number of functional weaknesses with the prior art. With said gate between the emitter and the collector, prior art devices behave similar to triode vacuum tubes. In such prior art devices, if the voltage between the collector and the emitter is sufficient to induce field emission, then the gate must be connected to a voltage source lower than the emitter voltage to turn the device off. If the collector to emitter voltage is not sufficient to induce emission, then a positive voltage applied to the gate can cause emission to begin. However, such a positive voltage will create a gate current, and unwanted effect, which will increase as the positive potential on the gate increases. In the case that the voltage potential of the gate is near to that of the collector, the undesired gate current can be much higher than the desired collector-emitter current. These undesirable characteristics make it difficult to have one prior art device drive another, as the required gate input voltages are different from the device output voltages.

Another functional problem with the prior art is that such devices cannot be made into complimentary pair configurations where one of the devices will turn on with an applied high voltage, while the other turns on with an applied low voltage. Complimentary pairs are very valuable in making integrated circuits that are simple, fast, and consume low amounts of power.

With their fabrication difficulties, gate voltage requirements, high operational voltage, and their inability to be made in complimentary pairs, prior art devices are not easily integrated together into practical circuits.

Accordingly there exists a need for field emission devices that can be easily integrated together into practical circuitry.

SUMMARY OF THE INVENTION

The present invention has been developed in order to overcome the above-mentioned weaknesses that are inherent in the prior art, and to provide a variety of switching devices that can be easily utilized by the electronics industry.

The present invention is a field emission transistor which is easily fabricated in a planar fashion by modern semiconductor fabrication technology. Said invention regulates the collector-emitter current by means of insulated gates that are not between the emitter and collector. A gate near the collector produces an N type transistor, which turns on with the application of a high signal.

The insulated gate regulates the collector-emitter current by changing the field intensity between the collector and the emitter. The close proximity of the collector to the emitter, as well as the application of photons to the emitter, result in very low operational voltages.

In another embodiment, the insulated gate is placed near the emitter, creating a P type transistor, which turns on by the application of a low signal.

In a further embodiment, both P type and N type transistors are integrated together into a complimentary pair that has a single gate, and has enhanced on-state characteristics.

In still another embodiment, the P and N type transistors are integrated together to form NAND gates and NOR gates, the building blocks for digital logic circuits.

DETAILED DESCRIPTION OF THE INVENTION

Figure 1:
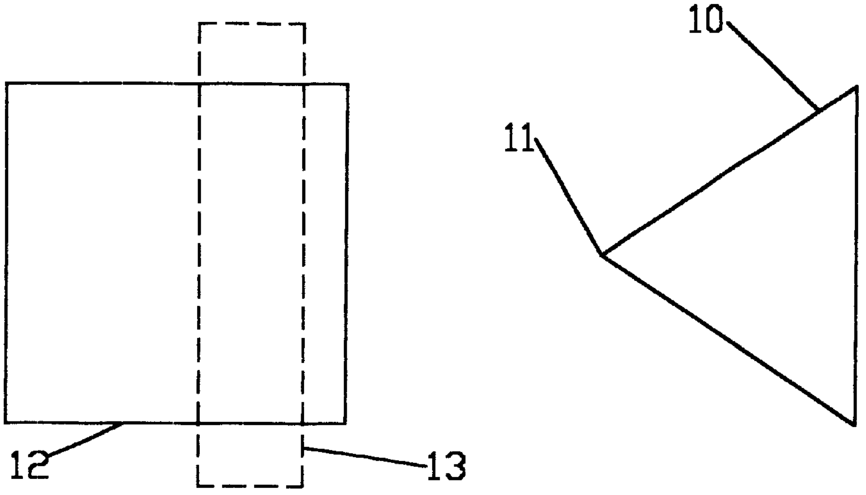
FIG. 1 is a top view of an N type field emission transistor.
Figure 2:
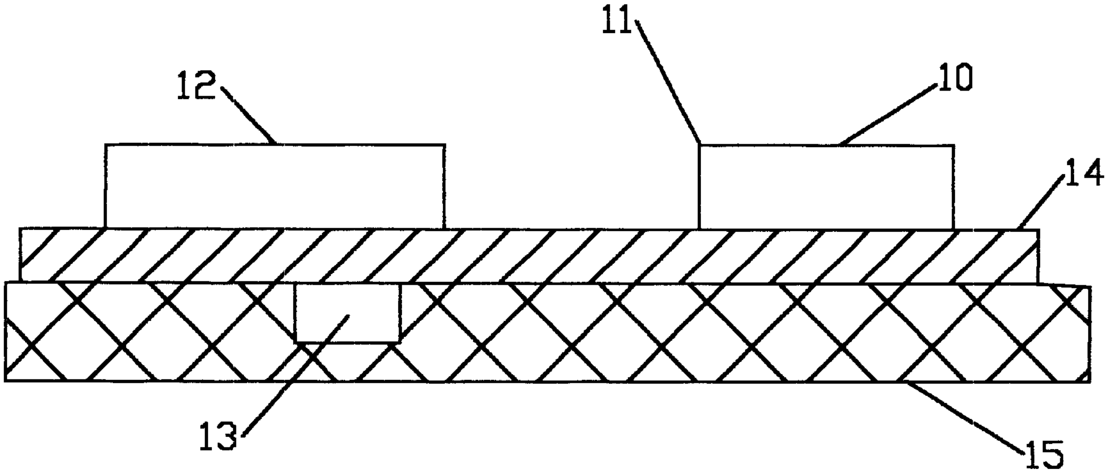
FIG. 2 is a side view of an N field emission transistor.

FIGS. 1 AND 2 show the construction of an N type field emission transistor. The construction is planer, as best seen is FIG. 2. The emitter 10 is created with a sharp tip 11 pointing towards the collector 12. Both emitter 10 and collector 12 are made of conductive materials, and are positioned in close proximity to each other on top of insulating layer 14. Positioned underneath insulating layer 14, and under the emitter-facing side of collector 12 is conducting gate 13. This entire structure is created on the top side of insulating substrate 15.

The operation of a field emission transistor is best understood by looking at the relationship between the electric field density at tip 11, and the current emitted by said tip. The current density J, emitted from tip 11, is given by the following formula:

$$J=CE^2e^{-K/E}$$

Where C and K are constants related to the work function of tip 11, and E is the electric field density.

In the range of interest, this formula reveals that a change of 20% in field density E can result in a change in current density of a factor of 10,000. Therefore by making small changes in the field between tip 11 and collector 12, large changes in current are possible.

Figure 3:
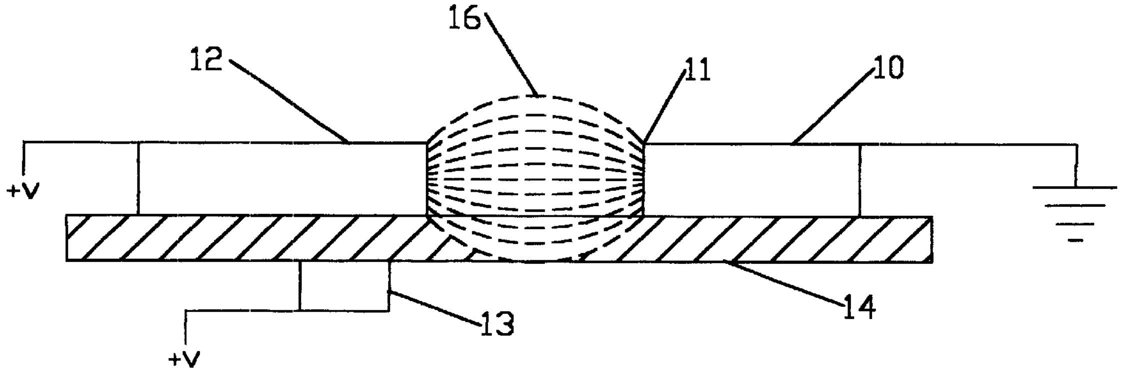
FIG. 3 is a side view of an N type field emission transistor in the ON state.
Figure 4:
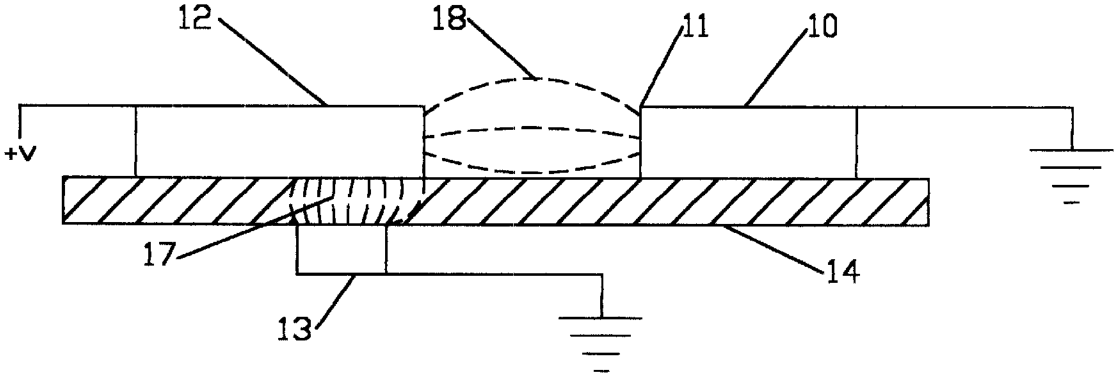
FIG. 4 is a side view of an N type field emission transistor in the OFF state.

The operation of an N type field emission transistor is shown in FIGS. 3 AND 4. FIG. 3 shows that with gate 13 at the same voltage potential as collector 12, the strong field lines 16 between collector 12 and emitter tip 11 are essentially unimpeded, and are therefore strong enough to induce electron emission from tip 11 of emitter 10 towards collector 12. The N type field emission transistor is therefore in the ON state.

FIG. 4 shows that when the gate voltage on gate 13 is low, the field lines 17 between collector 12 and gate 13 become intense, like the field between plates of a parallel plate capacitor. Just as the edge field of a parallel plate capacitor is low, so the application of a low voltage at gate 13 decreases the field 18 coming from the edge of collector 12. This decreased field 18 significantly lowers the field density at tip 11, and the N type field emission transistor is effectively turned OFF.

Figure 5:
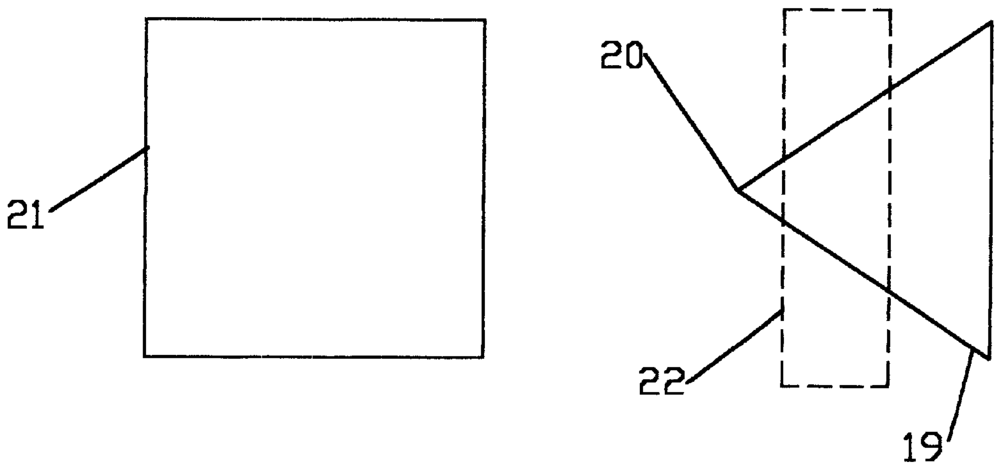
FIG. 5 is a top view of a P type field emission transistor.
Figure 6:
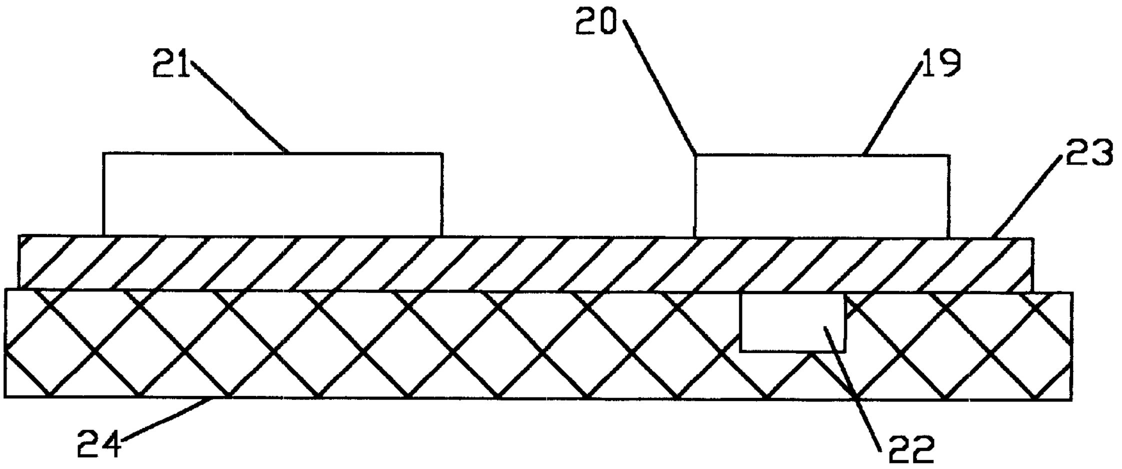
FIG. 6 is a side view of a P type field emission transistor.

FIGS. 5 and 6 show the construction of a P type field emission transistor. The construction is planer, as best seen is FIG. 6. The emitter 19 is created with a sharp tip 20 pointing towards the collector 21. Both emitter 19 and collector 21 are made of conductive materials, and are positioned in close proximity to each other on top of insulating layer 23. Positioned underneath insulating layer 23, and under the emitter-facing side of collector 21 is conducting gate 22. This entire structure is created on the top side of insulating substrate 24.

Figure 7:
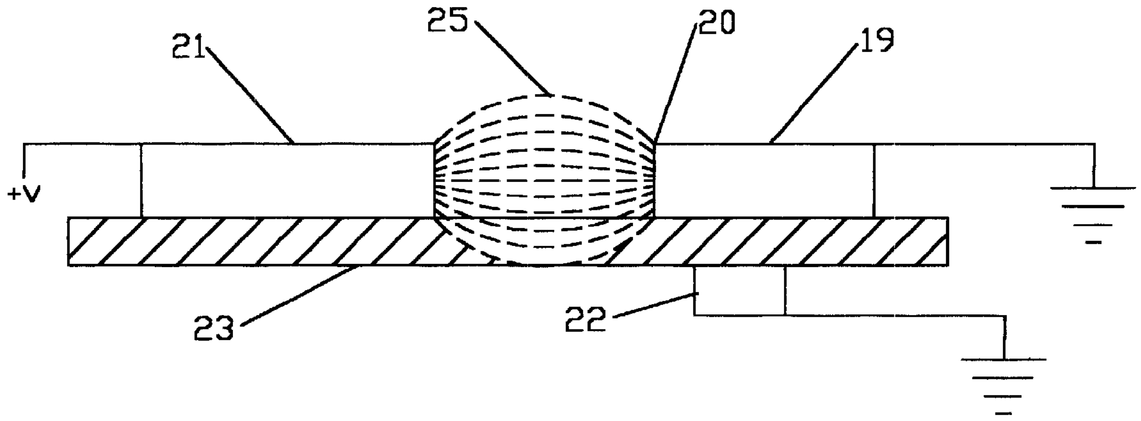
FIG. 7 is a side view of a P type field emission transistor in the ON state.
Figure 8:
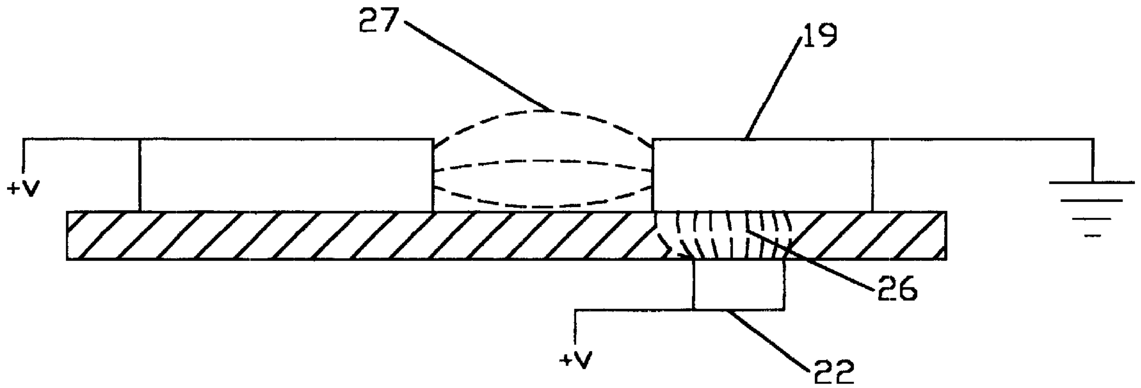
FIG. 8 is a side view of a P type field emission transistor in the OFF state.

The operation of a P type field emission transistor is shown if FIGS. 7 and 8. FIG. 7 shows that with the gate held at low voltage, the strong field lines 25, between emitter tip 20 and collector 21 are essentially unimpeded, and are therefore strong enough to induce electron emission from tip 20 towards collector 21. The P type field emission transistor is therefore in the ON state.

FIG. 8 shows that when the voltage on gate 22 is high, the field lines 26 between emitter 19 and gate 22 become intense. This intense field 26 significantly decreases the field lines 27, coming from the tip 20 of emitter 19, effectively turning the P type field emission transistor OFF.

A P type field emission transistor, and an N type field emission transistor can be combined together to make a complimentary pair. However, a more elegant and functional complimentary pair can be made using an integrated design, as shown in FIGS. 9 and 10.

Figure 9:
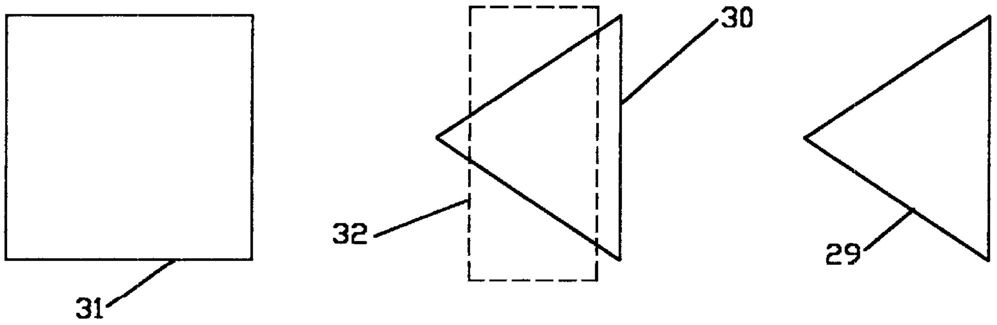
FIG. 9 is a top view of a complimentary pair of field emission transistors.
Figure 10:
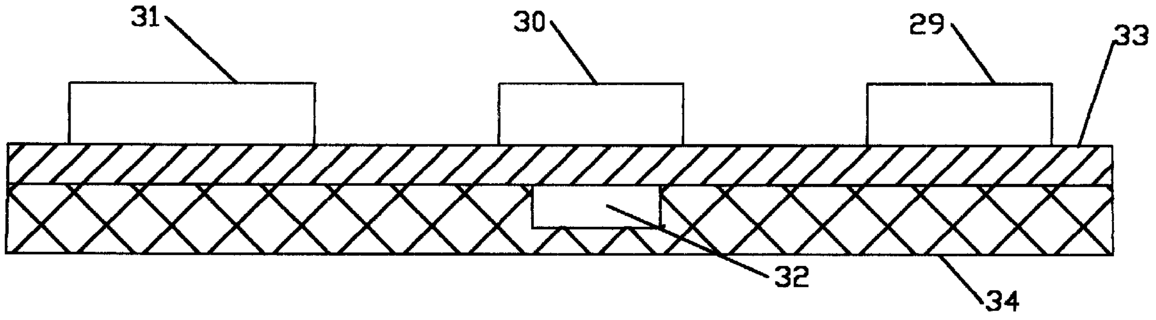
FIG. 10 is a side view of a complimentary pair of field emission transistors.

FIGS. 9 and 10 show that the complimentary pair is composed of an emitter 29, a floating center 30, and a collector 31, with a single gate 32, underneath insulating layer 33 and positioned below floating center 30. This entire structure is created on the top side of insulating substrate 34.

Figure 11:
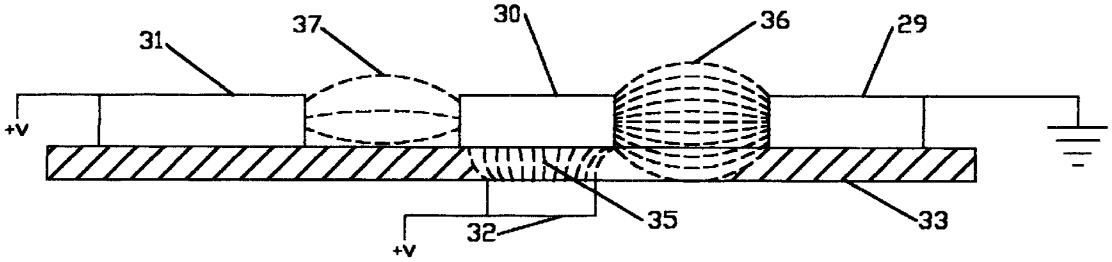
FIG. 11 is a side view of a complimentary pair of field emission transistors with the gate held high.
Figure 12:
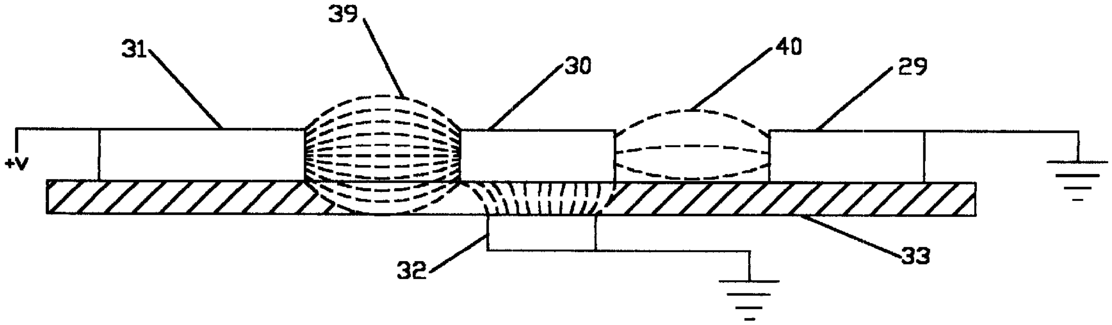
FIG. 12 is a side view of a complimentary pair of field emission transistors with the gate held low.

The operation of the complimentary pair is illustrated in FIGS. 11 and 12. FIG. 11 shows that if gate 32 is held high, then floating center 30 will act like an N type collector to emitter 29, and will induce electron emission from said emitter. At the same time, floating center 30 will act as a P type emitter to collector 31. The high voltage on gate 32 will cause this P type emitter to effectively turn OFF, due to reduced field 37 between floating center 30 and collector 31.

It will be noted that the field lines 35 between gate 32 and floating center 30 actually enhance the strength of field lines 36 going to emitter 29. Therefore, the on-state voltage between floating center 30 and emitter 29 will be significantly lower than what would be calculated as a minimum voltage needed for emission.

In FIG. 12, gate 32 is held low. This causes the N type transistor between emitter 29 and floating center 30 to turn OFF. The P type transistor between floating center 30 and collector 31 is turned ON by the low voltage at gate 32.

Analogous to the N type side, the field lines 38, between gate 32 and floating center 30, enhance the field lines 39 going from floating center 30 to collector 31. Therefore the on-state voltage between collector 31 and floating center 30 will be significantly lower than what would be calculated as minimum voltage needed for emission.

In the operation of a field emission transistor, as disclosed herein, it has been found that electrons emitted from the emitter will follow the field lines between the emitter tip and collector. Looking at FIG. 3, it will be noted that field lines 16 go below the surface level of insulating layer 14. Therefore, electrons following those field lines would collide with the surface of insulating layer 14. It was experimentally found that these electrons would then ionize the surface of said insulating layer, and this ionization would cause inconsistent results. Sometimes the ionization would create a conductive path between the emitter and the collector, causing a short circuit. Other times, the buildup of negative charge on the insulating surface would decrease the electric field intensity at the emitter tip until there would be no further emission, even at high applied voltages.

Figure 13:
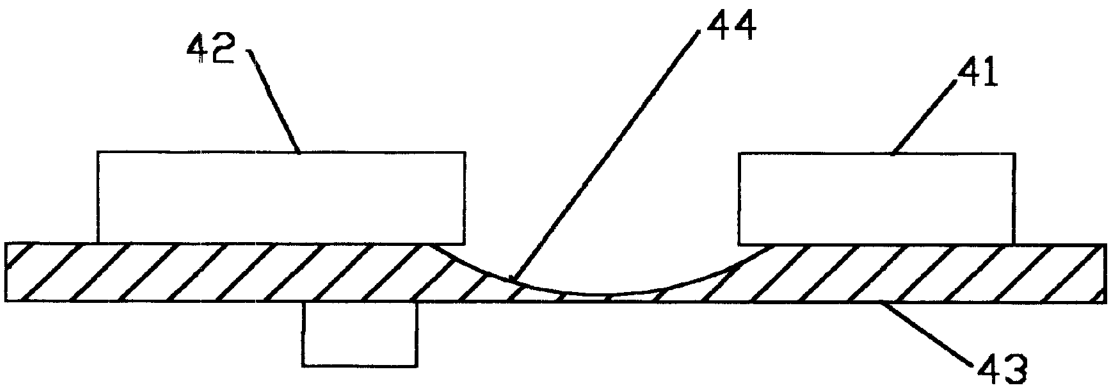
FIG. 13 is a side view of the emitter to collector region of a field emission transistor, showing the etched insulator layer underneath.

The solution to this problem is shown in FIG. 13. The emitter 41 and the collector 42 are still spaced relative to each other, and placed over insulating layer 43, as in hereinabove described embodiments. However, an etching 44 has been performed in insulating layer 43 between emitter 41 and collector 42. This etching 44 is not only down between emitter 41 and collector 42, but also underneath their respective tips. Etching 44 not only allows electrons to more fully follow electric field lines without impinging upon insulating layer 43, but the etching under the tips virtually eliminates the possibility of short circuits caused by ionization. Also, the depression of the etching 44 between collector 42 and emitter 41 will not allow the buildup of negative charge to adversely affect the direct field lines between emitter 41 and collector 42. Thus the emission of electrons from emitter 41 will be largely unimpeded.

Figure 14:
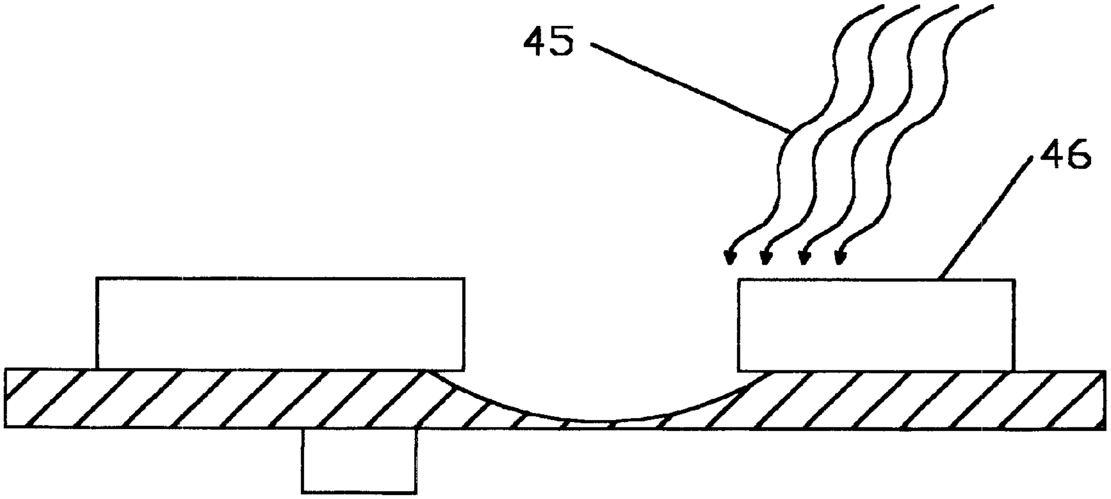
FIG. 14 is a side view of the emitter to collector region of a field emission transistor, showing incident photons on the emitter.

FIG. 14 shows the impinging of photons 45 on the emitter 46 of a field emission transistor. With the work function of most stable metals being in the range of 3 to 5 eV, and visible light photons carrying energies of 2 to 3 eV, it can be seen that photons 45 can impart a large share of the energy needed for electrons to leave emitter 46. Experimental results have shown that this effect is much stronger in field emission transistors of smaller geometries, undoubtably due to tunneling effects. Experimental results also show that, with small geometries, incident photons on the emitter greatly reduce the threshold voltage needed for field emission.

Figure 15:
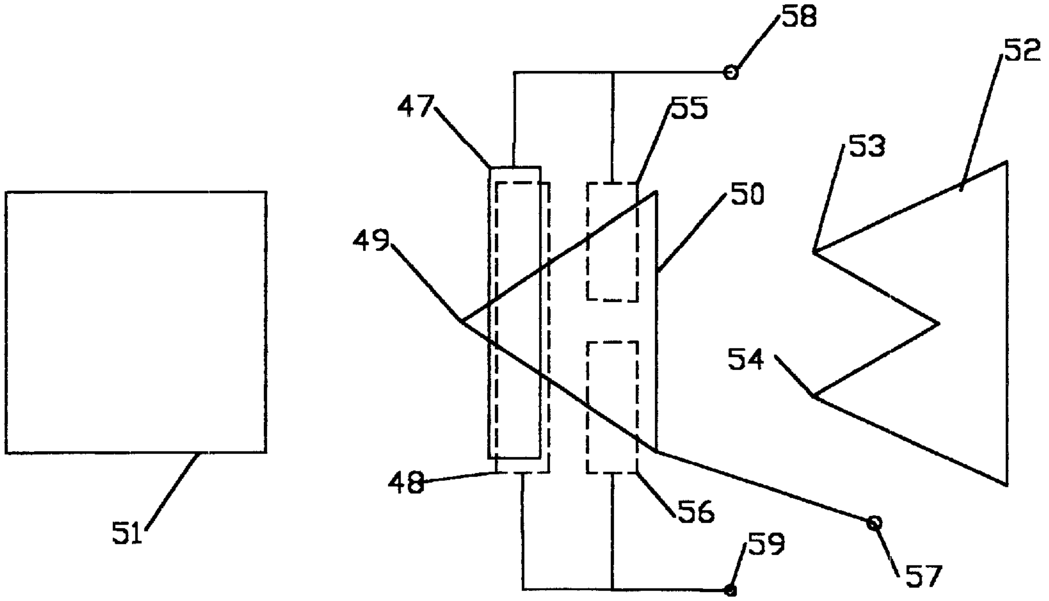
FIG. 15 is an integrated NOR gate fabricated from P and N type field emission transistors.
Figure 16:
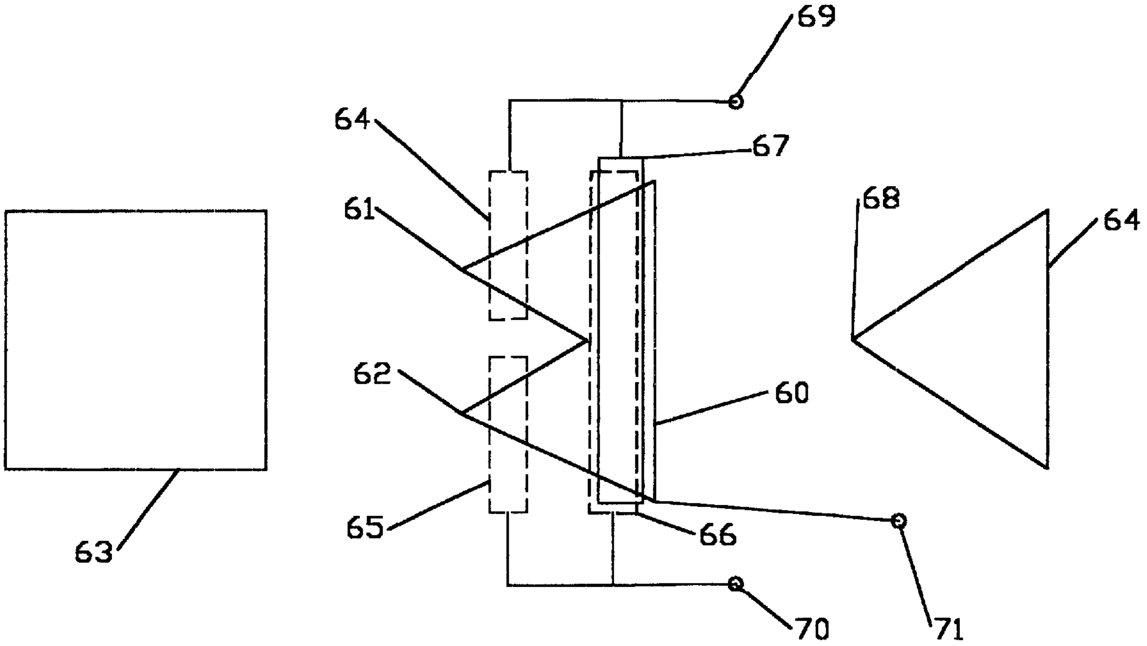
FIG. 16 is an integrated NAND gate fabricated from P and N type field emission transistors.

FIGS. 15 and 16 show the design of NOR and NAND gates constructed from P and N type field emission transistors. However, before reviewing these figures, it should be noted that the previous figures have all shown gates located underneath the insulating layer, below the emitter or collector in question. However, there is no reason that a gate cannot be located above a collector or emitter, isolated by an insulating layer on top. This gate-on-top construction will be noted in FIGS. 15 and 16.

Referring now to FIG. 15, it will be noted that there are two gates, 47 and 48, located near the tip 49 of a floating center 50. Gate 48, shown as a dotted line, is underneath tip 49, and gate 47 is above tip 49, separated by an equal thickness insulating layer. If either, or both, gate 47 or 48 is held high, the parallel plate capacitor effect will keep tip 49 from emitting. If both 47 and 48 are held low, then tip 49 will emit electrons. And there will be conduction between floating center 50 and collector 51.

It will be noted that emitter 52 has two sharp tips, 53 and 54. Each of these tips 53 and 54 are pointed towards floating center 50. Underneath the side of floating center 50 that faces emitter 52 are two gates, 55 and 56. If either of these gates 55 or 56 are high, then one of the tips 53 or 54 of emitter 52 will conduct, and floating center 50 will be electrically connected, through the conducting electrons, to emitter 52. Output 57, connected to floating center 50, would be pulled low, approaching the potential of emitter 52. If both gates 55 and 56 are held low, the parallel plate capacitor effect would cause both emitter tips 55 and 56 to stop emitting.

Gate 47 is electrically connected to gate 55 to form input 58, and gate 48 is electrically connected to gate 56 to form input 59. Therefore, if both inputs 58 and 59 are held low, emitter tip 49 emits electrons, while tips 53 and 54 are turned OFF. This would pull output 57 high, approaching the voltage of collector 51. If either or both inputs 58 or 59 are held high, emitter tip 49 is OFF, and either tip 53 or 54, or both, are conducting. This would pull output 57 low. These characteristics are those of a NOR gate.

FIG. 16 shows the construction of a NAND gate having a floating center 60 with two tips 61 and 62 pointing towards collector 63. Underneath tip 61 is gate 64, and underneath tip 62 is gate 65. In order for there to be no conduction between floating center 60 and collector 63, both gates 64 and 65 must be held at a high voltage.

On the side of floating center 60 that faces emitter 64 are also two gates, 66 and 67. One of these gates, 66, is underneath floating center 60, and gate 67 is above floating center 60, both isolated by insulating layers. If both gates 66 and 67 are held high, then tip 68 of emitter 64 is conducting, otherwise it is in the OFF state.

Gates 64 and 67 are connected together to form input 69, and gates 65 and 66 are connected together to form input 70. If either, or both, input 69 and 70 is held low, then output 71, connected to floating center 60, will be high. If both inputs 69 and 70 are held high, then output 71 will be low. These are the characteristics of a NAND gate.

Using the characteristics of field emission transistors, as disclosed herein, other logic devices and circuit elements, as needed, can be made of said transistors.

We claim as our invention:

1. An N type field emission transistor comprising;

a conducting collector;

a conductive emitter placed in close proximity to said collector; and an insulated conductive gate located closer to said collector than to said emitter, and said collector and said emitter are both positioned on one side of an insulating layer, and said gate is positioned on the opposite side of said insulating layer.

2. The device of claim 1 wherein the emitter is illuminated by photons.

3. The device of claim 1, having a depression in the insulating layer, said depression being on the same side of said insulating layer as the emitter and the collector, and said depression being between the two closest points of said emitter and said collector.

4. An P type field emission transistor comprising:

a conducting collector;

a conductive emitter placed in close proximity to said collector; and an insulated conductive gate located closer to said emitter than to said collector, and said collector and said emitter are both positioned on one side of an insulating layer, and said gate is positioned on the opposite side of said insulating layer.

5. The device of claim 4 wherein the emitter is illuminated by photons.

6. The device of claim 4, having a depression in the insulating layer, said depression being on the same side of said insulating layer as the emitter and the collector, and said depression being between the two closest points of said emitter and said collector.

7. An integrated complimentary pair of field emission transistors comprising:

an N field emission transistor;

a P type field emission transistor;

the collector of said N type transistor also serving as the emitter of said P type transistor; and a single gate that drives both transistors.

8. A NOR gate created from field emission transistors comprising:

two N type transistors;

a P type field emission transistor with two insulated gates, each gate residing on opposite sides of the emitter and substantially symmetrical about said emitter;

the collectors of said N type transistors being electrically connected to the emitter of said P type transistor; and the gates of each N type transistor being electrically connected to one of the gates of the P type transistor.

9. A NAND gate created from field emission transistors comprising:

two P type transistors;

an N type field emission transistor with two insulated gates, each gate residing on opposite sides of the collector and substantially symmetrical about said collector;

the emitters of said P type transistors being electrically connected to the collector of said N type transistor; and the gates of each P type transistor being electrically connected to one of the gates of the N type transistor.

* * * * *